US010656205B2

(12) United States Patent
Semmelmeyer et al.

(10) Patent No.: US 10,656,205 B2
(45) Date of Patent: May 19, 2020

(54) NARROW-PARALLEL SCAN-BASED DEVICE TESTING

(71) Applicant: Oracle International Corporation, Redwood City, CA (US)

(72) Inventors: Mark Semmelmeyer, Sunnyvale, CA (US); Ali Vahidsafa, Santa Clara, CA (US); Sebastian Turullols, Santa Clara, CA (US); Scott Cooke, Townsend, MA (US); Senthilkumar Diraviam, Sunnyvale, CA (US); Preethi Sama, Santa Clara, CA (US)

(73) Assignee: ORACLE INTERNATIONAL CORPORATION, Redwood, CA (US)

( * ) Notice: Subject to any disclaimer, the term of this patent is extended or adjusted under 35 U.S.C. 154(b) by 331 days.

(21) Appl. No.: 15/886,566

(22) Filed: Feb. 1, 2018

(65) Prior Publication Data

US 2019/0235023 A1    Aug. 1, 2019

(51) Int. Cl.
*G01R 31/3183*  (2006.01)
*G01R 31/28*  (2006.01)
(Continued)

(52) U.S. Cl.
CPC . *G01R 31/318307* (2013.01); *G01R 31/2834* (2013.01); *G01R 31/31724* (2013.01);
(Continued)

(58) Field of Classification Search
CPC ........ G01R 31/318307; G01R 31/2834; G01R 31/31724; G01R 31/318371; G01R 31/31919
See application file for complete search history.

(56) References Cited

U.S. PATENT DOCUMENTS

| 5,883,843 A * | 3/1999 | Hii | G01R 31/30 |
| | | | 365/201 |
| 2008/0092005 A1* | 4/2008 | Huott | G01R 31/318547 |
| | | | 714/738 |

(Continued)

OTHER PUBLICATIONS

Stroud, "A Designer's Guide to Built-in Self-Test", Chapter 1 2002 Kluwer Academic Publishers (Year: 2002).*

(Continued)

*Primary Examiner* — Regis J Betsch
(74) *Attorney, Agent, or Firm* — Snell & Wilmer L.L.P.; Kent A. Lembke

(57) ABSTRACT

Embodiments include systems and methods for in-system, scan-based device testing using novel narrow-parallel (NarPar) implementations. Embodiments include a virtual automated test environment (VATE) system that can be disposed within the operating environment of an integrated circuit for which scan-based testing is desired (e.g., a chip under test, or CuT). For example, the VATE system is coupled with a service processor and with the CuT via a novel NarPar interface. A sequence controller can drive a narrow set of parallel scan pins on the CuT via the NarPar interface of the VATE system in accordance with an adapted test sequence having bit vector stimulants and expected responses. Responses of the CuT to the bit vector stimulants can be read out and compared to the expected results for scan-based testing of the chip.

18 Claims, 3 Drawing Sheets

(51) Int. Cl.
G01R 31/319 (2006.01)
G01R 31/317 (2006.01)
(52) U.S. Cl.
CPC .......... G01R 31/31919 (2013.01); G01R 31/318371 (2013.01)

(56) References Cited

U.S. PATENT DOCUMENTS

2009/0158105 A1   6/2009  Konda
2013/0060502 A1*  3/2013  Dang ............. G01R 31/318544
                                                            702/108

OTHER PUBLICATIONS

Ti, "IEEE Std 1149.1 (JTAG) Testability Primer", 1997 (Year: 1997).*
Bao, Fang et al. "An Effort-Minimized DFT Scheme for Microcontroller Aimed at In-System Test" Dec. 2007.
van den Berg, Ardy et al. "Bandwidth Analysis for Reusing Functional Interconnect as Test Access Mechanism" May 2008.
Chen, Mingsong et al. "Functional Test Generation Using Efficient Property Clustering and Learning Techniques" Jan. 2010.
Dalirsani, Atefe et al. "On Covering Structural Defects in NoCs by Functional Tests" Nov. 2014.
Evaluation Engineering: "Testing two birds with one stone" Aug. 2014.
Gardner, Dan et al. "In-System Test for FPGAs" 2006.
Hely, David et al. "Scan Design and Secure Chips: Can They Work Together" Oct. 2006.
Hilscher, Martin et al. "Accelerated Shift Registers for X-tolerant Test Data Compaction" May 2008.
Holst, Stefan et al. "Adaptive Debug and Diagnosis without Fault Dictionaries" May 2008.
Han, Chao et al. "On the testing of hazard activated open defects" Oct. 2014.
1450.6.1-2009—IEEE Standard for Describing On-Chip Scan Compression 2009.
ISO 26262-8:2011(en), Road vehicles—Functional safety—Part 8: Supporting processes 2011.
Maheshwari, Richa et al. "Test Access Port & Scan Based Technique of In-System Timing Extraction and Control" 2010.
Moretti, Gabe "What is Not Testable is Not Fixable" Sep. 2014.
Novak, Ondrej et al. "COMPAS—Compressed Test Pattern Sequencer for Scan Based Circuits" 2005.
Press, Ron "Cars drive new DFT technologies" Mar. 4, 2014.
Rowe, Martin "Best-in-Test 2014: Software/Embedded Test" Nov. 27, 2013.
Stroud, Charles et al. "Built-In Self-Test and Diagnosis of Multiple Embedded Cores in SOCS" 2004.
Tayade, Rajeshwary et al. "Critical Path Selection for Delay Test Considering Coupling Noise" May 2008.
Wang, Laung-Terng et al. "VirtualScan: A New Compressed Scan Technology for Test Cost Reduction" 2004.
Ueda, Motoo et al. "Automated system level functional test program generation on ATE from EDA using Functional Test Abstraction" Nov. 2012.
Varma, P. "On path delay testing in a standard scan environment" Oct. 1994.
Wang, Seongmoon et al. "Low Overhead Partial Enhanced Scan Technique for Compact and High Fault Coverage Transition Delay Test Patterns" May 2008.
West, Burnell G. "Accuracy Requirements in At-Speed Functional Test" Sep. 1999.
https://en.wikipedia.org/wiki/IEC_61508#Testing_software Nov. 12, 2017.
https://en.wikipedia.org/wiki/ISO_26262 Oct. 9, 2017.

* cited by examiner

NARROW-PARALLEL SCAN-BASED DEVICE TESTING

FIELD

Embodiments relate generally to integrated circuit testing systems, and, more particularly, to narrow-parallel, in-system, scan-based device testing systems and techniques for using such systems.

BACKGROUND

Many semiconductor parts are conventionally tested using scan-based test patterns driven by automated test equipment (ATE). The ATE is typically an expensive system located in a laboratory testing environment, and use of the ATE typically involves appreciable time and resources. It can often be difficult for semiconductor designers to get sufficient access to the ATE to perform more than a minimal amount of testing, and there can be resistance to non-ATE personnel contributing to scan patterns. For example, once a part has finished its ATE testing, it can be impractical to retest semiconductors after minor changes have been made to the semiconductor parts, after scan patterns have been improved, etc.

Further, because the ATE is implemented as specialized laboratory equipment, it cannot generally be used to test semiconductors in their operational environments. This can lead to sub-optimal design and testing prior to release (e.g., over-engineering, etc.), and also tends to prevent any subsequent scan-based testing of the semiconductor parts after installation. Due to these and other ATE-related concerns, the semiconductor industry has tended to compromise between test cost and test quality, and to compromise during post-silicon bring-up and production ramp between cost for replacing parts (e.g., removal of device tested by an older test flow and attachment of devices that have been tested by a subsequent, better test flow; test flow being comprised of a sequence of test programs each associated with an environment of voltages, temperature, etc., and test program comprised of a sequence of test vectors and/or test patterns, and test pattern being comprised a sequence of test vectors, test patterns often ATE scan patterns) and enduring with parts that have potential latent problems; additionally the desire for retest can arise because of stresses incurred during the remaining manufacturing process and delivery to customers. In some cases, this has driven use of alternative testing techniques, such as so-called Joint Test Action Group (JTAG) testing, but those alternatives tend to be exceedingly slow, incomplete, or otherwise undesirable.

BRIEF SUMMARY

Among other things, embodiments provide systems and methods for in-system, scan-based device testing using novel narrow-parallel (NarPar) implementations. Embodiments include a virtual automated test environment (VATE) system that can be disposed within the operating environment of an integrated circuit for which scan-based testing is desired (e.g., a chip under test, or CuT). For example, the VATE system is coupled with a service processor and with the CuT via a novel NarPar interface. A sequence controller can drive a narrow set of parallel scan pins on the CuT via the NarPar interface of the VATE system in accordance with an adapted test sequence having bit vector stimulants and expected responses. Responses of the CuT to the bit vector stimulants can be read out and compared to the expected results for scan-based (e.g., structural) testing of the chip.

BRIEF DESCRIPTION OF THE DRAWINGS

The present disclosure is described in conjunction with the appended figures.

Figure 1:
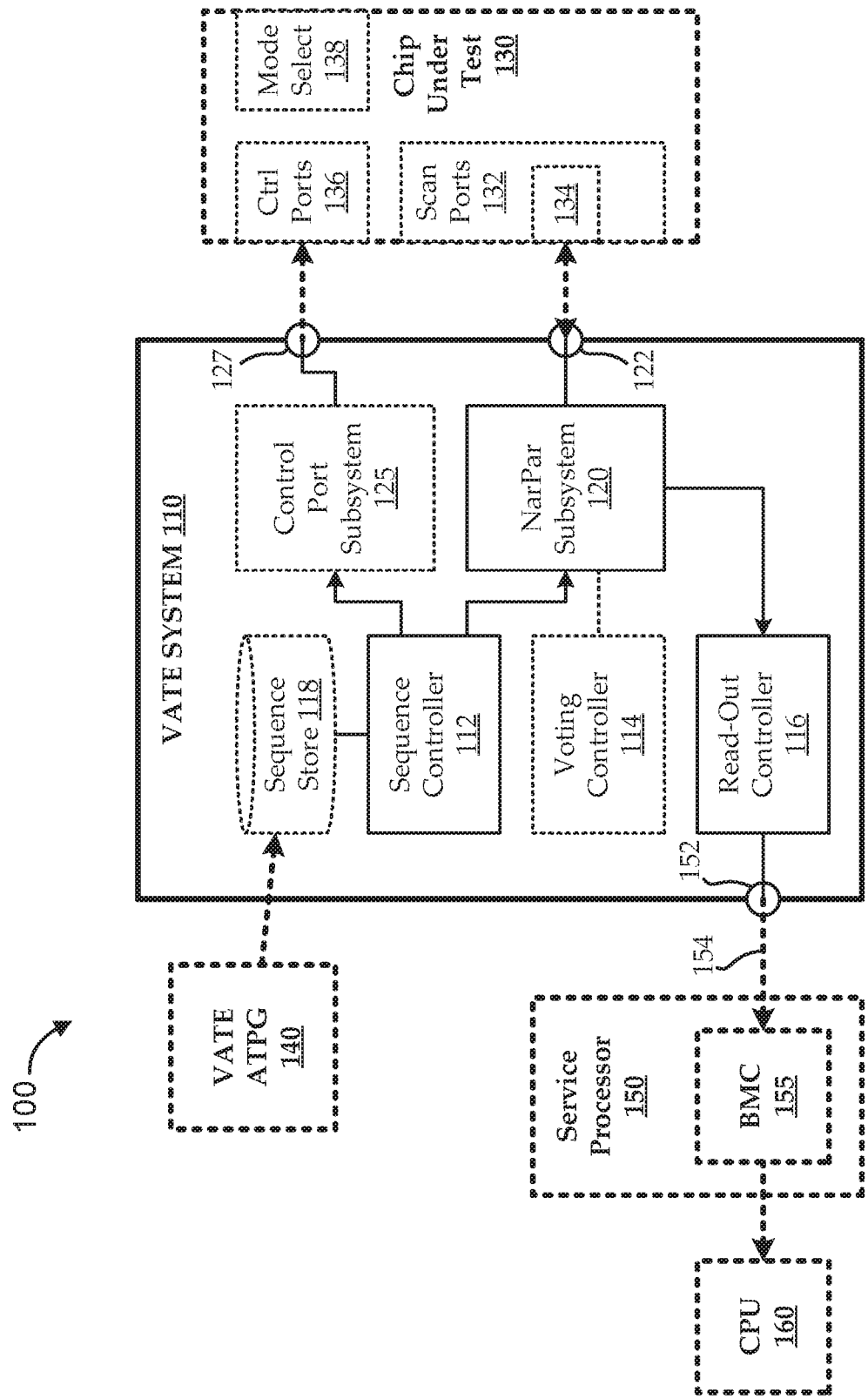
FIG. 1 shows a simplified block diagram of an illustrative in-system chip testing environment, as a context for various embodiments.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Many semiconductor parts are conventionally tested using scan-based test patterns driven by ATE. For example, the semiconductor includes one or more integrated circuits that can be set to a scantest mode. In a typical scan test mode, all the flip-flops, or the like, are connected into a chain, and said flip-flops (or the like) ignore the normal logic. A test pattern is loaded into the integrated circuit, thereby effectively programming all the flip flops without having to access them through many input pins and logical functions. Such testing can exploit the structure of the integrated circuit for effective scan-based testing, and can be referred to as structural testing. Such structural testing can be particularly applicable for memories (e.g., random access memory) and other types of integrated circuits having substantially regular structures.

Conventionally, an automated test pattern generator (ATPG) is programmed with specific characteristics of the chip to be tested and specific characteristics of the ATE setup to be used for the testing. As an example, an ATPG can generate a set of test bit vectors that include stimulants and expected responses for tens of scan pins and control pins of the chip. Typically, the expected responses include a mask and a value to match against. Though generated automatically, the bit vectors are typically debugged and/or otherwise modified before use. Prior to installing the chip in its operational environment, the chip can be tested using the generated bit vectors. Such testing can involve installing the chip in a dedicated interface to the ATE and loading the ATE with the generated (and debugged, etc.) bit vectors. During the testing, the ATE can drive the pins of the chip with stimulants indicated by the bit vectors, which can effectively load various bit patterns through registers and/or other structures of the chip; and the ATE can read out response vectors from the semiconductor. The response vectors can be compared to expected results to determine if the semiconductor is operating as expected.

Embodiments described herein include a novel VATE implemented in circuitry of the operating environment of the semiconductor under test. Embodiments of the VATE can interface with the semiconductor using a novel NarPar interface. The VATE can provide a number of features. One feature is that the VATE implementation does not rely on expensive dedicated equipment for testing. Another feature is that the VATE permits testing of the semiconductor in its operational environment, which can allow for designs with smaller guardbands, and the like. Another feature is that the VATE permits retesting of a semiconductor after installation, which can allow for testing with later-developed scan patterns, for periodic or on-demand diagnostic testing, etc. Yet another feature is that, because the VATE is only for use with the particular semiconductor under test, it is not subject to limited availability of laboratory resources and related concerns. Still another feature is that the NarPar interface can operate with appreciably fewer pins exposed for testing, which can reduce package and board costs.

Turning first to FIG. 1, a simplified block diagram is shown of an illustrative in-system chip testing environment 100, as a context for various embodiments. The environment 100 includes a VATE system 110 that can provide an in-system implementation of scan-based testing features conventionally implemented by external ATE. The VATE system 110 is shown in context of an illustrative chip under test 130. The chip under test 130 can be any processor, memory chip, or other suitable test that can benefit from scan-based (e.g., structural) testing. In some embodiments, the VATE system 110 is referred to as implemented "in system," generally indicating that the VATE system 110 can be implemented within the same operating environment as the chip under test 130. For example, the VATE system 110 can be implemented as a state machine, a field programmable gate array (FPGA), set of circuit blocks, processor, etc., which can be integrated with a mezzanine board, mother board, or any other suitable structure of a computational system that is also the operating environment of the chip under test 130. As such, the VATE system 110 can be in communication with other components of the computational system, such as one or more service processors (SP) 150, one or more central processing units 160 (CPU), etc.

Embodiments of the VATE system 110 can include a sequence controller 112, a NarPar subsystem 120, and a read-out controller 116. Some embodiments further include a control port subsystem 125 and/or a voting controller 114. The sequence controller 112 can include a test sequence input to receive a stored test sequence. For example, the sequence controller 112 is in communication with (or includes) a sequence store 118 having the test sequence stored thereon. The sequence store 118 can include any suitable type of memory and can be implemented as part of the VATE system 110 or in a component that is separate from, but in communication with, the VATE system 110. For example, the sequence controller 112 can be in communication with a file server (not shown) separate from the VATE system 110, and the file server can implement the sequence data store 118 having the test sequence stored thereon. The stored test sequence includes a plurality of bit vector stimulants and expected responses. In some embodiments, the test sequence is previously generated by an ATPG that is adapted for a NarPar port set 134 having parallel scan-in ports and a plurality of scan-out ports that are a subset of parallel scan ports 132 of an integrated circuit (i.e., a chip under test 130, as described below). In some implementations, the chip under test 130 includes a particular set of scan ports 132 used by conventional ATE testing, and the NarPar port set 134 is a subset of those ports. In other implementations, the NarPar port set 134 is a unique set of parallel scan ports separate from the scan ports that would be used by conventional ATE testing. In still other implementations, there is partial overlap between the NarPar port set 134 and the scan ports that would be used by conventional ATE testing. An implementation of an ATPG adapted for use with the VATE system 110 is illustrated as VATE ATPG 140.

Embodiments of the NarPar subsystem 120 are coupled with the sequence controller 112 and have a NarPar interface 122. The NarPar interface 122 is adapted to couple with the NarPar port set 134. For example, as illustrated, the chip under test 130 can include scan ports 132 and control ports 136; and the NarPar port set 134 can be a subset of the scan ports 132. Each port can include a pin or other chip interface structure. Conventionally, scan ports (e.g., parallel scan-in and scan-out ports) of a chip are embedded into the chip in such a way as to permit an external ATE interface to access all the scan ports for testing. Such testing typically relies on use of a dedicated ATE setup in a testing laboratory environment (i.e., outside the operating environment of the chip). In contrast, according to embodiments described herein, the chip under test 130 can be implemented to operate in context of the specialized VATE system 110 that can perform at least some of the testing on at least some of the blocks of the chip under test 130 at high bandwidth without using an external ATE. In some embodiments, the scan ports 132 include multi-mode pins that can operate in an operational mode (e.g., adapted for when the chip is operating and is not being tested), in a standard ATE test mode (e.g., adapted for interfacing with a conventional external ATE in a non-operating environment), and in a NarPar mode (e.g., for interfacing with the VATE system 110 in the operating environment). The mode selection can be performed using a mode selector 138 on the chip under test 130, which can be implemented as a pin, switch, or in any other suitable manner. When in the NarPar test mode, the NarPar interface 122 of the VATE system 110 can drive the "narrow" subset of the parallel (e.g., wpi and wpo) scan ports 132 (i.e., the NarPar port set 134) provided by dedicated test mode logic in the chip under test 130.

Many chips under test 130 have regular structures, and many of those regular structures can be replicated on the chip. In some instances, sections of the chip under test 130 are isolated (e.g., the inputs and outputs are "unknown" or "do not care" from one section to the next). In such instances, when the chip is in the NarPar test mode, pins corresponding to those sections can be multiplexed, so that the narrow NarPar port set 134 interface to the chip effectively drives an appreciably wider set of structures within the chip under test 130. In other instances, sections of the chip under test 130 can be non-isolated (e.g., they have inputs and/or outputs that depend on those of another section) and/or non-replicate (e.g., different types of structures). As an example, a chip under test 130 can include many non-replicate units that each talk to each other. In such an instance, a conventional ATE setup may drive many pins to affect the many non-replicate units, but the relatively small number of pins in the NarPar port set 134 available to the VATE system 110 may be insufficient to test all those units. Such a lack of access to the units can also limit the ability of the VATE system 110 to maintain control over the interfaces between those units. In such instances, the test sequence can be generated to account for the interfaces between the units being undefined (e.g., the VATE ATPG 140 can be configured not to have a defined state of the inter-unit interfaces) and/or the generated bit vectors can be adapted (e.g., automatically or manually) to account for such undefined interface conditions. The generated test sequence, then, can be used by the VATE system 110 to drive the NarPar port set 134 in such instances.

In some implementations, the sequence controller 112 receives the stored test sequence from the sequence store 118. As described above, the test sequence includes bit vector stimulants and expected responses adapted for the NarPar port set 134. The sequence controller 112 can then drive the NarPar port set 134 according to the received bit vector stimulants via the NarPar subsystem 120 and the NarPar interface 122. For example, a sequence of bit vector stimulants of the test sequence is used to drive the scan-in ports of the NarPar port set 134. Assuming the chip under test 130 is set to the NarPar test mode, driving the NarPar port set 134 in this manner can cause registers and/or other structures of the chip under test 130 to be set in sequence, thereby causing a particular response of the chip under test 130 to manifest at the scan-out ports of the NarPar port set 134. That chip response can be received as read-out data from one or more of the scan-out ports in response to the driving. As illustrated, the read-out data can be received by the read-out controller 116 via the NarPar interface 122. In some implementations, the read-out data is received by the NarPar subsystem 120 via the NarPar interface 122 and passed to the read-out controller 116.

The read-out data can be analyzed according to (e.g., compared to) the expected responses defined by the test sequence, which can indicate whether the chip under test 130 is performing as expected (e.g., whether there are any structural or other issues present in the chip under test 130). In some implementations, the analysis of the read-out data is performed by the read-out controller 116 within the VATE system 110. In other implementations, the analysis is performed by one or more other components. For example, the read-out data can be transferred by the read-out controller 116 to the service processor 150, a central processing unit 160, etc. that is part of the operating environment.

In one illustrative implementation, the chip under test 130 has eighty scan data ports available to a conventional ATE, and all those ports can be available when the chip under test 130 is in a normal test mode (e.g., when a TESTMODE selector pin of the mode selector 138 is HIGH). When in a NarPar test mode (e.g., when a NARPAR_TESTMODE selector pin of the mode selector 138 is HIGH), the same chip under test 130 can perform muxing to two scan-data-in ports driven by the NarPar subsystem 120 of the VATE system 110 and to sixteen scan-out ports received by the NarPar subsystem 120 of the VATE system 110. Though there are eighteen ports interacting with the NarPar subsystem 120, some implementations limit the number of concurrent data streams. For example, only 1, 2, 3, or 4 corresponding data streams (e.g., through two inputs and a corresponding number of outputs) interact with a baseboard management controller (BMC) 155 of the service processor 150 (e.g., a 400 MHz non-OOO ARM926 CPU of the BMC) in the operating environment of the chip under test 130. In such an implementation, the read-out interface 152 between the VATE system 110 and the BMC 155 can include a low pin count (LPC) bus 154 with a relatively low bandwidth (e.g., no higher than 100 kilobits per second), which can facilitate a single-transaction-per-cycle protocol and account for latencies of transaction originations, responses, and terminations (e.g., as seem by the ARM CPU, which can have no more than one outstanding load or store at a time).

In some such implementations, the NarPar subsystem 120 is in communication with (or includes) a voting controller 114 to consolidate the scan-out ports of the chip under test 130. In some operating environments (e.g., with replicate units within the chip under test 130), there may be more read-out bits than read-in bits (e.g., one read-in bit and multiple read-out bits), which can cause a service processor 150, or the like, to experience an input-output imbalance. Accordingly, the voting controller 114 can use a comparator or other component to reduce the read-outs to more closely match the read-ins (e.g., by effectively serializing the read-outs). In one implementation, there is one input data stream, one output data stream, and one mask data stream; and the voting controller 114 can adapt the mask data stream to effectively select which outputs to use, and which to ignore. For example, sixteen scan-out ports of the example above can be consolidated into one or two data-out streams (e.g., effectively acting as a dual or single virtual data-out port). The consolidated data-out streams can be passed through the LPC bus 154 (e.g., on the motherboard), into the service processor 150, further into the BMC 155 (e.g., and its system on chip (SoC) logic), and further into a main CPU 160.

In many cases, the chip under test 130 includes multiple replicate structures. For example, a multi-CPU processor, a chip with multiple communication links (e.g., a multiple SerDes), a memory chip, or the like, can have many structures designed to be repeated on the chip. In such cases, it can often be expected that each replicate structure will respond in the same way to a particular input data stream. Accordingly, embodiments of the NarPar subsystem 120 can check the actual output data stream received from the chip under test 130 via NarPar interface 122 to determine whether response data streams from replicate structures match. In one embodiment, the NarPar subsystem 120 receives from the sequence store 118 (e.g., via the sequence controller 112) an input test data stream and an expected output data stream, and a mask data stream. During testing, the NarPar subsystem 120 receives an actual output data stream (response data) from the chip under test 130 via the NarPar interface 122 in response to communicating the input test data stream to the chip under test 130 via the NarPar interface 122. As the actual output data stream is received, the NarPar subsystem 120 can compare the response data to the expected data stream to look for indications of defects in the chip under test 130. In some cases, certain parts of the actual output data stream are not considered as indicative of defects, as they correspond to unpredictable, uncontrolled, or otherwise indeterminate data conditions. For example, certain structures in the chip under test 130 can have undefined starting states, data can be poorly controlled at or near certain input/output boundaries, different replicate structures can include input ports that are coupled with different constant values, certain types of structures (e.g., certain memory structures) can be difficult to initialize in a deterministic manner, etc. In such cases, the NarPar subsystem 120 can receive a mask data stream from the sequence store 118, which can mask out the portions of the actual output data stream not to use for testing (i.e., not considered indicative of defects). Notably, in such cases, three data streams (the input test data stream, the expected output data stream, and the mask data stream) are being communicated between the sequence store 118 and the NarPar subsystem 120. In the event that any link between the sequence store 118 and the NarPar subsystem 120 is constrained, communicating all three streams can effectively limit the testing speed (i.e., by becoming a bottleneck).

In other embodiments, the voting controller 114 can be used to reduce the number of signals involved in the testing. In cases where multiple replicate structures, if operating properly, are expected to generate the same response data; bit-wise differences between any of the response data streams from the different replicate structures can indicate a defect in one or more of the replicate structures. In such cases, some embodiments of the NarPar subsystem 120 receive the input test data stream and the mask data stream from the sequence store 118, without receiving the expected output data stream. As the actual output data stream is received, the NarPar subsystem 120 (e.g., or the voting controller 114) can compare the response data across replicate data structures to look for differences as indications of defects in the chip under test 130. For example, at a particular bit location of the response data, if the majority of replicate structures indicate a first value, and a minority indicates a second value; the minority can be considered as exhibiting a defect. In various implementations, the voting can indicate a defect whenever a majority indicates a same result, whenever there is less than a unanimous result, based on a fixed or programmable threshold, or based on any other suitable determination. In some such embodiments, any detected defects can result in an overall determination that the chip under test 130 is defective (e.g., the chip under test 130 generally fails the test). In other such embodiments, the voting controller 114 can maintain statistics regarding some or all of: a numbers of defects, which replicate structures appeared to exhibit the defects, a histogram of the degree of agreement among the replicate structures represented in the result data, at which bits of the response data the defects were detected, etc.

By using the voting controller 114 to compare actual output data stream results for replicate structures, the NarPar subsystem 120 can operate without using the expected output data stream. This can reduce the number of signals (or streams) being sent from the sequence store 118 to the NarPar subsystem 120 (e.g., to only the input test data stream and the mask data stream), which can relieve some constraints (e.g., burden, load, etc.) on that link and can potentially increase testing speed. In cases where the outputs of the data structures in the chip under test 130 are determinate (e.g., there are no indeterminate bit values), embodiments of the NarPar subsystem 120 can perform testing of the actual output data stream further without using the mask data stream. This can further reduce the number of signals (or streams) being sent from the sequence store 118 to the NarPar subsystem 120 (e.g., to only a single stream—the input test data stream), which can further relieve constraints on that link and can further potentially increase testing speed.

The above embodiments are described with the NarPar subsystem 120 performing testing processing on the actual output data stream. In such embodiments, any suitable output data can be passed through the read-out controller 116 (e.g., acting as an interface) to the service processor 150. In other embodiments, some or all of the testing processing of the actual output data stream can be performed by the read-out controller 116. For example, the NarPar subsystem 120 can receive the actual output data stream via the NarPar interface 122, and can pass the actual output data stream to the read-out controller 116 for processing. In such embodiments, the read-out controller 116 can receive any other signals used for processing (e.g., an expected output data stream and/or a mask data stream) either from the sequence store 118, from the NarPar interface 122, or in any other suitable manner. Further, in some such embodiments, the voting controller 114 can be part of, or coupled with, the read-out controller 116.

Alternatively, in other embodiments, some or all of the testing processing of the actual output data stream can be performed by the service processor 150. For example, the NarPar subsystem 120 can receive the actual output data stream via the NarPar interface 122, and can pass the actual output data stream to the service processor 150 for processing via the read-out controller 116 through the LPC bus 154. In such embodiments, the read-out controller 116 can also communicate any other signals used for processing (e.g., an expected output data stream and/or a mask data stream) to the service processor 150 through the LPC bus 154, and the service processor 150 can include the voting controller 114. In some implementations, the LPC bus 154 is a highly constrained link, and it can be desirable to reduce the amount of signaling communicated across the LPC bus 154. Accordingly, voting techniques, such as those described above, can be used to reduce the number of signals (or streams) used for testing (e.g., to enable testing of the actual output data stream without using an expected output data stream and/or without using a mask data stream).

Some embodiments of the VATE system 110 further include a control port subsystem 125 that can interface with control ports 136 of the chip under test 130 via a control port interface 127. Some implementations of the control ports 136 are Joint Test Action Group (JTAG) ports, and the control port subsystem 125 can include a JTAG accelerator block to drive the JTAG ports (e.g., TDI (Test Data In), TDO (Test Data Out), TCK (Test Clock), TMS (Test Mode Select), and TRST (Test Reset) ports). In some implementations, some or all of the control ports 136 include a multi-mode control pin that can operate in at least a mission mode (e.g., normal operational mode) and a test mode (e.g., for NarPar testing). Embodiments of the control port subsystem 125 can operate to detect, while the NarPar port set 134 is being driven by the NarPar subsystem 120 according to the bit vector stimulants, one of the bit vector stimulants as previously associated with a structural adaptation in the integrated circuit. In response to the detecting, a control signal can be communicated by the control port subsystem 125 to the chip under test 130 directing the structural adaptation in the chip under test 130 in temporal accordance with the NarPar port set 134 being driven by the detected one of the bit vector stimulants. As illustrated, some implementations of the control port subsystem 125 are disposed within the VATE system 110. In other implementations, the control port subsystem 125 is disposed at least partially in the service processor 150 (or any other suitable component of the operating environment).

Generally, the service processor 150 is a processor having certain peripherals. In some embodiments, the service processor 150 implements the sequence controller 112 and/or other components of the VATE system 110. For example, the service processor 150 can run a test program that effectively drives the test sequence. Though shown as a separate component, some embodiments implement some or all of the VATE system 110 as part of the service processor 150, or implement some or all of the service processor 150 as part of the VATE system 110.

Figure 2A:
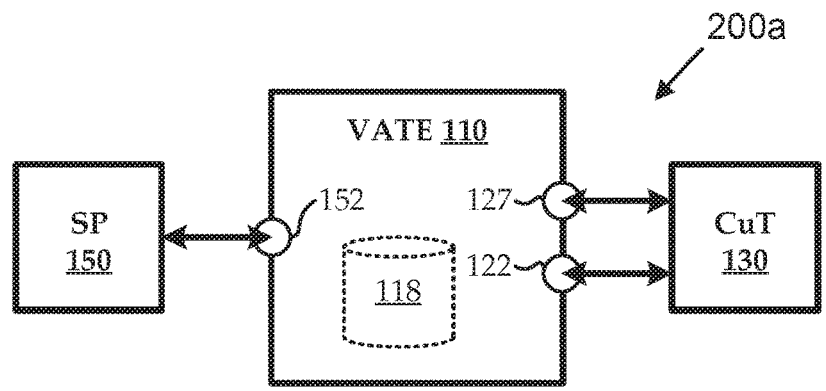
FIGS. 2A-2C show various implementations of illustrative in-system chip testing environments, each including an illustrative VATE system, according to various embodiments.
Figure 2B:
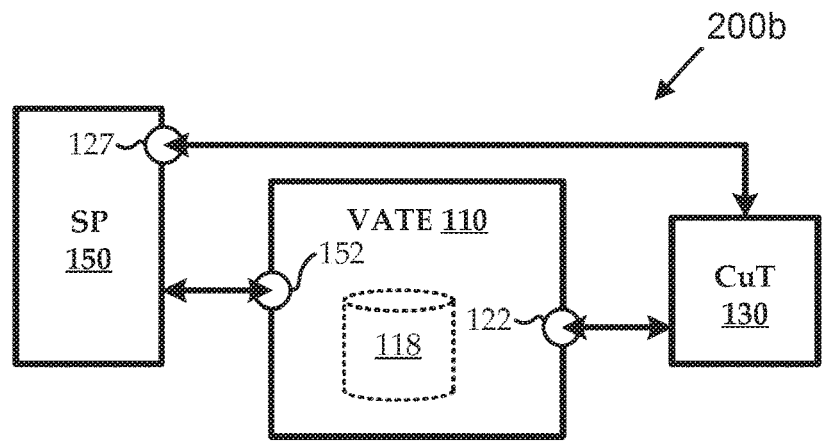
Figure 2C:
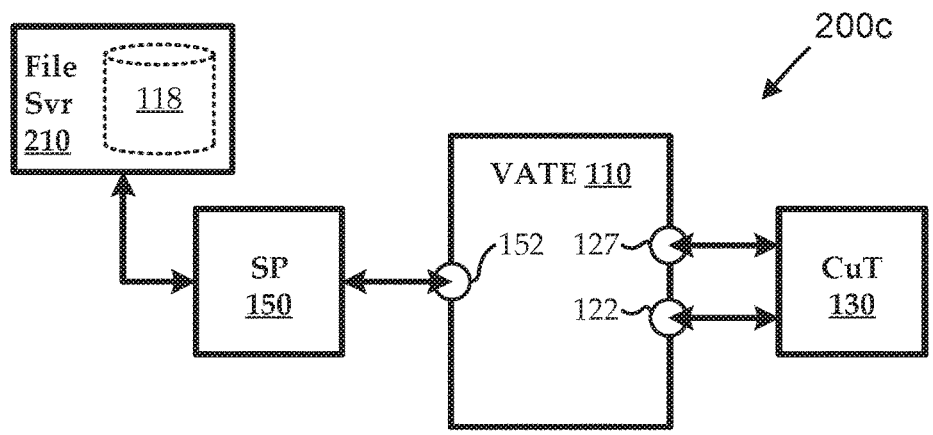

FIGS. 2A-2C show various implementations of illustrative in-system chip testing environments 200, each including an illustrative VATE system 110, according to various embodiments. Various components of the VATE system 110, the chip under test 130, the service processor 150, etc. are not explicitly shown to avoid overcomplicating the illustration; and those components are referenced according to their designations in FIG. 1. FIG. 2A shows an illustrative in-system chip testing environment 200a, in which the VATE system 110 includes a sequence store 118 and is coupled between the chip under test 130 and a service processor 150. Such a VATE system 110 implementation can include both a NarPar subsystem 120 interfacing with the NarPar port set 134 of the chip under test 130 via a NarPar interface 122, and a control port subsystem 125 interfacing with the control ports 136 of the chip under test 130 via a control port interface 127. The VATE system 110 drives the NarPar port set 134 according to bit vectors of a test sequence on the sequence store 118, reads response data from the NarPar port set 134, and delivers read-out data to the service processor 150 via a read-out interface 152 according to the response data.

FIG. 2B shows another illustrative in-system chip testing environment 200b, in which the VATE system 110 and service processor 150 drive the chip under test 130 according to a test sequence. In such an implementation, the VATE system 110 can include the NarPar subsystem 120 interfacing with the NarPar port set 134 of the chip under test 130 via a NarPar interface 122, and the service processor 150 can include the control port subsystem 125 interfacing with the control ports 136 of the chip under test 130 via a control port interface 127. As in FIG. 2A, the VATE system 110 drives the NarPar port set 134 according to bit vectors of a test sequence on the sequence store 118, reads response data from the NarPar port set 134, and delivers read-out data to the service processor 150 via a read-out interface 152 according to the response data. Unlike FIG. 2A, the service processor 150 in FIG. 2B can be used to communicate control port commands to the chip under test 130 during the test sequence, for example, to direct structural modifications to the chip and/or other adjustments as part of the test sequence.

FIG. 2C shows a third illustrative in-system chip testing environment 200c. Like FIG. 2A, the VATE system 110 is coupled between the chip under test 130 and the service processor 150 and includes both the NarPar subsystem 120 (interfacing with the NarPar port set 134 of the chip under test 130 via the NarPar interface 122) and the control port subsystem 125 (interfacing with the control ports 136 of the chip under test 130 via the control port interface 127). Unlike FIG. 2A, the sequence store 118 is not disposed in the VATE system 110. Rather, the sequence store 118 is implemented by a file server 210 remote to the VATE system 110, which can be in communication with the VATE system 110 directly, through the service processor 150 (as shown), or in any other suitable manner. In such an implementation, the VATE system 110 can operate in a similar manner to the implementation of FIG. 2A.

Figure 3:
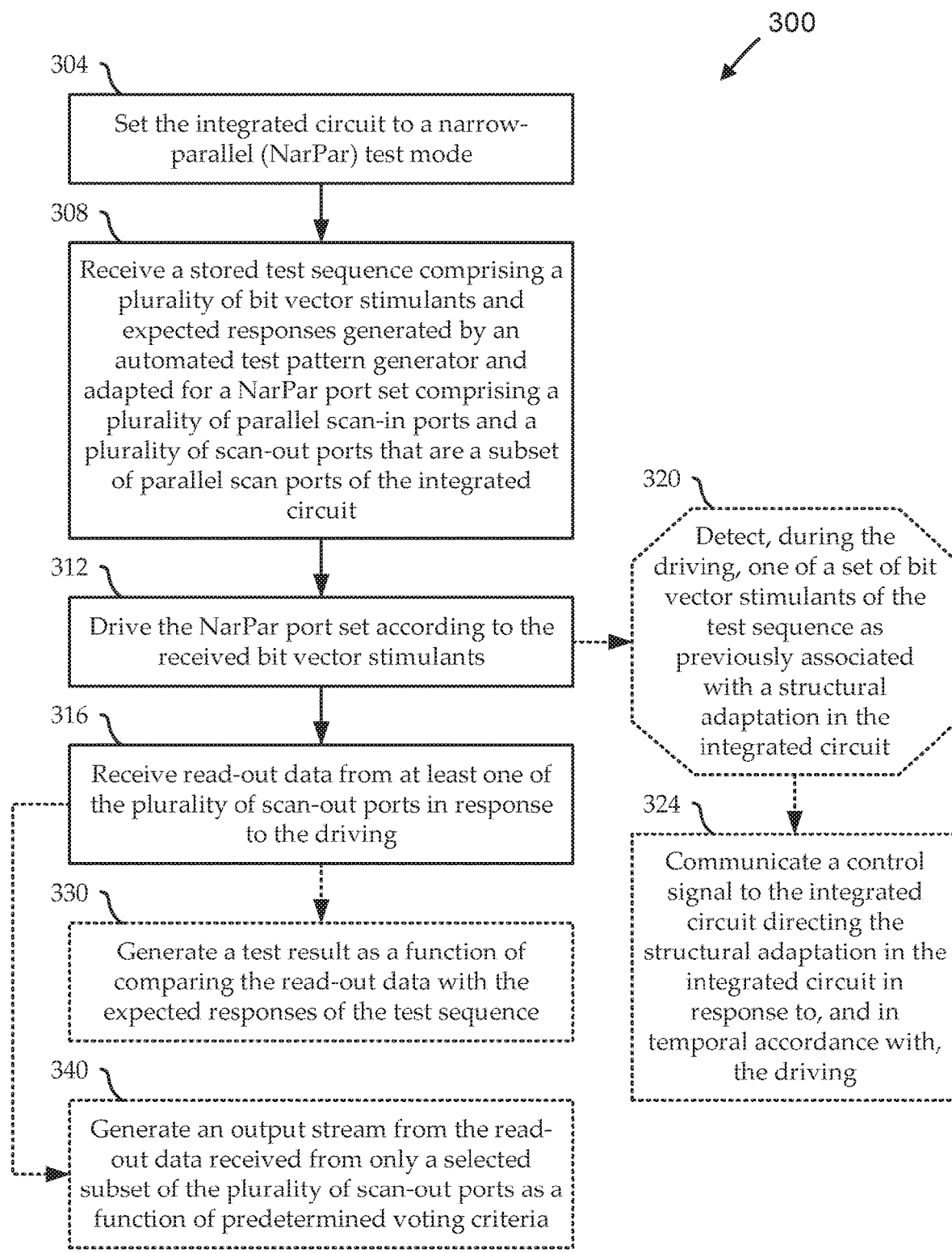
FIG. 3 shows a flow diagram of an illustrative method for scan-based testing of an integrated circuit installed in an operational environment.

FIG. 3 shows a flow diagram of an illustrative method 300 for scan-based testing of an integrated circuit installed in an operational environment. The method 300 can be implemented using any suitable system components, including those described with reference to FIGS. 1-2C. Embodiments begin at stage 304 by setting an integrated circuit (e.g., the chip under test 130) to a NarPar test mode. For example, the setting can be performed by actuating a pin of a mode selector 138, or in any other suitable manner. In some implementations, the setting at stage 304 sets various multiplexers and/or other structures within the chip under test 130 to a mode that can exploit the narrower NarPar port set 134 of the scan ports 132.

At stage 308, embodiments can receive a stored test sequence having multiple bit vector stimulants and expected responses. The test sequence can be previously generated by an ATPG adapted for the NarPar port set 134 of the chip under test 130. At stage 312, embodiments can drive the NarPar port set 134 according to the received bit vector stimulants. The chip under test 130 can respond to being driven by the test sequence, so that a particular sequence of response data manifests at scan-out ports of the chip under test 130. The response data can be received as read-out data, at stage 316, from at least one of the scan-out ports in response to the driving at stage 312.

Some embodiments continue at stage 320 by detecting (during the driving at stage 312) one of a set of bit vector stimulants of the test sequence as previously associated with a structural adaptation in the chip under test 130. At stage 324, in response to the detecting at stage 320, embodiments can communicate one or more control signals to the chip under test 130 directing the structural adaptation in the chip under test 130. The control signal can cause the structural adaptation to occur in the chip under test 130 in temporal accordance with the driving, so that the structures of the chip under test 130 are in the desired adapted states at the desired times for driving the chip under test 130 according to the detected bit vectors.

Other embodiments continue from stage 316 by using the read-out data in one or more ways. In some such embodiments, at stage 330, a test result can be generated as a function of comparing the read-out data with the expected responses of the test sequence. Such a comparison can indicate whether there is a structural or other issue in the chip under test 130 that is detectable by scan-based testing. In other such embodiments, at stage 340, an output stream can be generated from the read-out data received from only a selected subset of the scan-out ports as a function of predetermined voting criteria.

The methods disclosed herein include one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A system for scan-based testing of an integrated circuit installed in an operational environment, the system comprising:
    a virtual automated test environment (VATE) system comprising:
    a sequence controller having a test sequence input to receive a stored test sequence comprising a plurality of bit vector stimulants and expected responses generated by an automated test pattern generator and adapted for a NarPar port set comprising a plurality of parallel scan-in ports and a plurality of scan-out ports that are a subset of parallel scan ports of the integrated circuit;
    a narrow-parallel (NarPar) subsystem coupled with the sequence controller and having a NarPar interface to couple with the NarPar port set;
    a read-out controller coupled with the NarPar subsystem to receive read-out data from at least one of the plurality of scan-out ports in response to the integrated circuit being set to a NarPar test mode and the NarPar port set being driven by the NarPar subsystem according to the bit vector stimulants; and
    a mezzanine board having the VATE system and the integrated circuit disposed thereon.

2. The system of claim 1, wherein the VATE system further comprises:
    a sequence data store, having the test sequence stored thereon.

3. The system of claim 1, wherein the sequence controller is in communication with a file server separate from the VATE system, and the file server comprises a sequence data store having the test sequence stored thereon.

4. The system of claim 1, further comprising:
    the integrated circuit, coupled with the NarPar subsystem via at least the NarPar interface, the integrated circuit comprising the parallel scan ports, and comprising a mode selector to set the integrated circuit to the NarPar test mode.

5. The system of claim 1, wherein the VATE system further comprises:
    a voting controller coupled with the read-out controller to direct the read-out controller to generate an output stream from the read-out data received from only a selected subset of the plurality of scan-out ports.

6. The system of claim 1, wherein the VATE system further comprises:
    a control port subsystem coupled with the sequence controller and having a control port interface to couple with a control port set of the integrated circuit.

7. The system of claim 6, wherein the control port subsystem operates to:
    detect, while the NarPar port set is being driven by the NarPar subsystem according to the bit vector stimulants, one of the bit vector stimulants as previously associated with a structural adaptation in the integrated circuit; and
    communicate, in response to the detecting, a control signal to the integrated circuit directing the structural adaptation in the integrated circuit in temporal accordance with the NarPar port set being driven by the detected one of the bit vector stimulants.

8. The system of claim 6, wherein the control port set comprises a set of Joint Test Action Group (JTAG) ports.

9. The system of claim 1, further comprising:
    a service processor coupled with the read-out controller via a low-pin-count (LPC) bus.

10. The system of claim 9, wherein the VATE system further comprises:
    a control port subsystem and having a control port interface to couple with a control port set of the integrated circuit, the control port subsystem disposed at least partially in the service processor.

11. A method for scan-based testing of an integrated circuit installed in an operational environment, the method comprising:
    setting the integrated circuit to a narrow-parallel (NarPar) test mode;
    with a virtual automated test environment (VATE), receiving a stored test sequence comprising a plurality of bit vector stimulants and expected responses generated by an automated test pattern generator and adapted for a NarPar port set comprising a plurality of parallel scan-in ports and a plurality of scan-out ports that are a subset of parallel scan ports of the integrated circuit;
    with the VATE, driving the NarPar port set according to the received bit vector stimulants, wherein the VATE and the integrated circuit are disposed on a mezzanine board; and
    receiving read-out data from at least one of the plurality of scan-out ports in response to the driving.

12. The method of claim 11, further comprising:
    detecting, during the driving, one or more of a set of bit vector stimulants of the test sequence as previously associated with a structural adaptation in the integrated circuit; and
    communicating a control signal to the integrated circuit directing the structural adaptation in the integrated circuit in response to, and in temporal accordance with, the driving.

13. The method of claim 11, further comprising:
generating a test result as a function of comparing the read-out data with the expected responses of the test sequence.

14. The method of claim 11, further comprising:
generating an output stream from the read-out data received from only a selected subset of the plurality of scan-out ports as a function of predetermined voting criteria.

15. The method of claim 11, wherein the receiving comprises receiving the test sequence by a sequence controller from a sequence data store local to the sequence controller.

16. The method of claim 11, wherein the receiving comprises receiving the test sequence by a sequence controller from a file server remote from the sequence controller.

17. A processor coupled with a memory having instructions stored thereon, which, when executed, cause the processor to perform steps comprising:
setting the integrated circuit to a narrow-parallel (NarPar) test mode;
receiving a stored test sequence comprising a plurality of bit vector stimulants and expected responses generated by an automated test pattern generator and adapted for a NarPar port set comprising a plurality of parallel scan-in ports and a plurality of scan-out ports with each being a differing subset of parallel scan ports of the integrated circuit;
driving the NarPar port set according to the received bit vector stimulants;
receiving read-out data from at least one of the plurality of scan-out ports in response to the driving;
detecting, during the driving, one of a set of bit vector stimulants of the test sequence as previously associated with a structural adaptation in the integrated circuit; and
communicating a control signal to the integrated circuit directing the structural adaptation in the integrated circuit in response to, and in temporal accordance with, the driving.

18. The processor of claim 17, wherein the steps further comprise:
generating a test result as a function of comparing the read-out data with the expected responses of the test sequence.

* * * * *

UNITED STATES PATENT AND TRADEMARK OFFICE
CERTIFICATE OF CORRECTION

PATENT NO. : 10,656,205 B2  
APPLICATION NO. : 15/886566  
DATED : May 19, 2020  
INVENTOR(S) : Semmelmeyer et al.

It is certified that error appears in the above-identified patent and that said Letters Patent is hereby corrected as shown below:

On the Title Page

Column 1, under Assignee, Line 2, delete "Redwood, CA" and insert -- Redwood City, CA --, therefor.

Signed and Sealed this  
Fourth Day of May, 2021

Drew Hirshfeld  
*Performing the Functions and Duties of the*  
*Under Secretary of Commerce for Intellectual Property and*  
*Director of the United States Patent and Trademark Office*